(12) United States Patent
Storck

(10) Patent No.: US 7,723,214 B2
(45) Date of Patent: May 25, 2010

(54) MULTILAYER STRUCTURE COMPRISING A SUBSTRATE AND A LAYER OF SILICON AND GERMANIUM DEPOSITED HETEROEPITAXIALLY THEREON, AND A PROCESS FOR PRODUCING IT

(75) Inventor: Peter Storck, Mehring (DE)

(73) Assignee: Siltronic AG, Munich (DE)

( * ) Notice: Subject to any disclaimer, the term of this patent is extended or adjusted under 35 U.S.C. 154(b) by 245 days.

(21) Appl. No.: 11/263,192

(22) Filed: Oct. 31, 2005

(65) Prior Publication Data

US 2006/0091502 A1 May 4, 2006

(30) Foreign Application Priority Data

Oct. 30, 2004 (DE) .................. 10 2004 052 788

(51) Int. Cl.
*H01L 21/36* (2006.01)
(52) U.S. Cl. ............... 438/479; 438/478; 438/481; 257/E21.102; 257/E21.103; 257/E21.104
(58) Field of Classification Search ......... 438/479, 438/481
See application file for complete search history.

(56) References Cited

U.S. PATENT DOCUMENTS

| 5,659,187 | A | 8/1997 | Legoues et al. | |
| 6,515,335 | B1 * | 2/2003 | Christiansen et al. | 257/347 |
| 6,524,935 | B1 | 2/2003 | Canaperi et al. | |
| 6,562,703 | B1 | 5/2003 | Maa et al. | |
| 6,995,430 | B2 * | 2/2006 | Langdo et al. | 257/352 |
| 7,405,142 | B2 | 7/2008 | Shiono et al. | |
| 2004/0067644 | A1 | 4/2004 | Malik et al. | |
| 2004/0152284 | A1 | 8/2004 | Ghyselen et al. | |
| 2004/0173812 | A1 | 9/2004 | Currie et al. | |
| 2004/0212035 | A1 | 10/2004 | Yeo et al. | |
| 2004/0214407 | A1 | 10/2004 | Westhoff et al. | |
| 2004/0259333 | A1 * | 12/2004 | Tomasini et al. | 438/478 |
| 2006/0258126 | A1 | 11/2006 | Shiono et al. | |

FOREIGN PATENT DOCUMENTS

| JP | 2003/197905 A | 7/2003 |
| JP | 2004/241507 A | 12/2009 |

OTHER PUBLICATIONS

Mantl et al. "Thin strain relaxed SiGe buffer layers on Si and SOI made by He+ ion implantation and annealing" Proceedings of the Third International Conference on SiGe(C) Epitaxy and Heterostructures (ICSI3), p. 120 2003.*

(Continued)

*Primary Examiner*—N Drew Richards
*Assistant Examiner*—Grant S Withers
(74) *Attorney, Agent, or Firm*—Brooks Kushman P.C.

(57) ABSTRACT

A multilayer structure, comprises a substrate and a layer of silicon and germanium (SiGe layer) deposited heteroepitaxially thereon having the composition $Si_{1-x}Ge_x$ and having a lattice constant which differs from the lattice constant of silicon, and a thin interfacial layer deposited on the SiGe layer and having the composition $Si_{1-y}Ge_y$, which thin interfacial layer binds threading dislocations, and at least one further layer deposited on the interfacial layer.

15 Claims, 2 Drawing Sheets

OTHER PUBLICATIONS

Dilliway, G. D. M "Characterization of morphology and defects in silicon-germanium virtual substrates" Journal of Mat. Sci.: Materials in Electronics 11 (2000) pp. 549-556.*

Freund, L. B. "A criterion for arrest of a threading disclocation in a strained epitaxial layer due to an interface misfit dislocation in its path" J. Appl. Phys. 68 (5), Sep. 1, 1990 pp. 2073-2080.*

Gaiduk, P. I. "Strain-relaxed SiGe/Si heteroepitaxial structures of low threading-dislocation density" Thin Solid Films 367 (2000) 120-125.*

Gupta, Saurabh "Thermally Relaxed Ultra-Thin SiGe Buffers" Annual Report 2006 pp. 1-2.*

Kasper, Erich "New virtual substrate concept for verticle MOS transistors" Thin Solid Films 1998 319-322.*

Kissinger, G "Stepwise equilibrated graded GexSi1-x buffer with very low threading dislocation density on Si(001)" Appl. Phys. Lett. 66 (16) Apr. 17, 1995 pp. 2083-2085.*

Lyutovich, Klara "Characterisation of virtual substrates with ultra-thin Si0.6Ge0.4 strain relaxed buffers" Materials Sci. in Semiconductor Processing 8 (2005) pp. 149-153.*

LeGoues, F. K. "Relaxation of SiGe thin films grown on Si/SiO2 substrates" J. Appl. Phys. 75 (11) Jun. 1, 1994 pp. 7240-7246.*

Leitz, C. W. "Dislocation glide and blocking kinetics in compositionally graded SiGe/Si" Jour. Appl. Phys. vol. 90 No. 6 Sep. 15, 2001 pp. 2730-2736.*

Linder, K. K. "Reduction of dislocation density in mismatched SiGe/Si using low temperature Si buffer layer" Appl. Phys. Lett. 70 (24) Jun. 16, 1997 pp. 3224-3226.*

Lytovich, Klara "Ultra-thin strain relaxed SiGe buffer layers with 40% Ge" Mat. Res. Soc. Symp. Proc. vol. 809 2004 pp. B1.4.1-B1.4.6.*

Prestling, H. "Ultrathin SimGenstrained layer superlattices—astep towards Si optoelectronics" Semicond. Sci. Technol. 7 (1992) pp. 1127-1148.*

Powell, A. R. "Formation of B-SiC nanocrystals by the relaxation of Si1-yCy random alloy layers" Appl. Phys. Lett 64 (3) Jan. 17, 1994 pp. 324-326.*

Tanaka, Masanori "Stress-relaxation mechanism in ultra-thin Sige on insulator formed by H+ irradiation-assisted ge condensation method" Thin Solid Films 517 (2008) pp. 248-250.*

Tezuka, Tsutomu "Lattice relaxation and dislocation generation/annihilation in SiGe-on-insulator layers during Ge condensation process" Thin Solid Films 508 (2006) pp. 251-255.*

Yang, Z. "In situ Si1-xGex epitaxial layers with low threading dislocation densities grown on compliant Si-on-insulator substrates" J. Vac. Sci. Technol. B 16 (3) May/Jun. 1998 pp. 1489-1491.*

* cited by examiner

MULTILAYER STRUCTURE COMPRISING A SUBSTRATE AND A LAYER OF SILICON AND GERMANIUM DEPOSITED HETEROEPITAXIALLY THEREON, AND A PROCESS FOR PRODUCING IT

BACKGROUND OF THE INVENTION

1. Field of the Invention

The subject matter of the present invention is a multilayer structure, comprising a substrate and a layer of silicon and germanium (SiGe layer) deposited heteroepitaxially thereon and having a lattice constant which differs from a lattice constant of the substrate. Silicon which is deposited on a SiGe layer of this type is biaxially strained. Since the mobility of charge carriers in strained silicon is higher than in unstrained silicon, electronic components which make use of strained silicon to increase the switching speed are receiving more and more interest.

2. Description of the Related Art

In particular an SiGe layer, which consists of a mixture of silicon and germanium with a germanium content of from 20 to 50% and is as far as possible completely relaxed, is suitable for the deposition of strained silicon. Since the lattice constant of the SiGe layer is greater than that of silicon, the silicon lattice which is deposited on a layer of this type is widened, producing a layer of strained silicon.

In general, silicon is also used as a substrate for the relaxed SiGe layer to be deposited on. On account of the different lattice constants, a heteroepitaxial layer which grows is initially strained itself. The strain disappears beyond a critical layer thickness, forming dislocations. Misfit dislocations tend to continue in a plane along the direction of growth of the growing layer. However, threading dislocations are also formed as extensions of misfit dislocations. These threading dislocations extend in the direction of growth of the SiGe layer and reach as far as the surface of this layer. This occurs to an increased extent if the deposited SiGe layer is relaxed during a simple heat treatment (anneal). Threading dislocations should be avoided wherever possible, since they usually continue in layers which are deposited on the SiGe layer and disrupt the functioning of electronic components which are integrated in layers of this type. Pile-ups of threading dislocations are particularly harmful. Another important parameter for the quality of the SiGe layer is the roughness of the surface, which should be as low as possible. Misfit dislocations produce stress fields and lead to local differences in the growth rate during the growth of the SiGe layer, and ultimately to a surface topography, known as "cross-hatch" topography, which is likewise transferred to layers deposited on the SiGe layer. A measure of this cross-hatch is the RMS roughness of the surface, measured for example by AFM (Atomic Force Microscopy).

Strategies have already been developed for reducing the density of threading dislocations. One possible option is to increase the concentration of germanium in the SiGe layer in steps or continuously. Another approach pursues the objective of depositing the SiGe layer on a layer which has a high concentration of point defects. Misfit dislocations then tend to form closed dislocation loops, which lead through the area with the high concentration of point defects, rather than to lengthen into threading dislocations directed toward the surface of the SiGe layer. The density of the threading dislocations which still reach the surface of the substrate is of the order of magnitude of at least $1 \cdot 10^7$ threading dislocations/$cm^2$ and is therefore still far too high for the material to be suitable for the fabrication of electronic components.

US2004/0067644 A1 has described a process which allows the density of threading dislocations to be reduced to below $1 \cdot 10^5$ threading dislocations/$cm^2$. The process substantially comprises etching the surface of the SiGe layer at the same time as the heat treatment which relaxes the SiGe layer (etch anneal process). An advantageous side-effect of so doing is that the surface roughness also decreases.

SUMMARY OF THE INVENTION

It is an object of the present invention to provide a multilayer structure and a simple process for producing it, in which the surface of the structure has a low roughness and a low density of threading dislocations and pile-ups of threading dislocations.

DETAILED DESCRIPTION OF THE PREFERRED EMBODIMENT(S)

Figure 1:
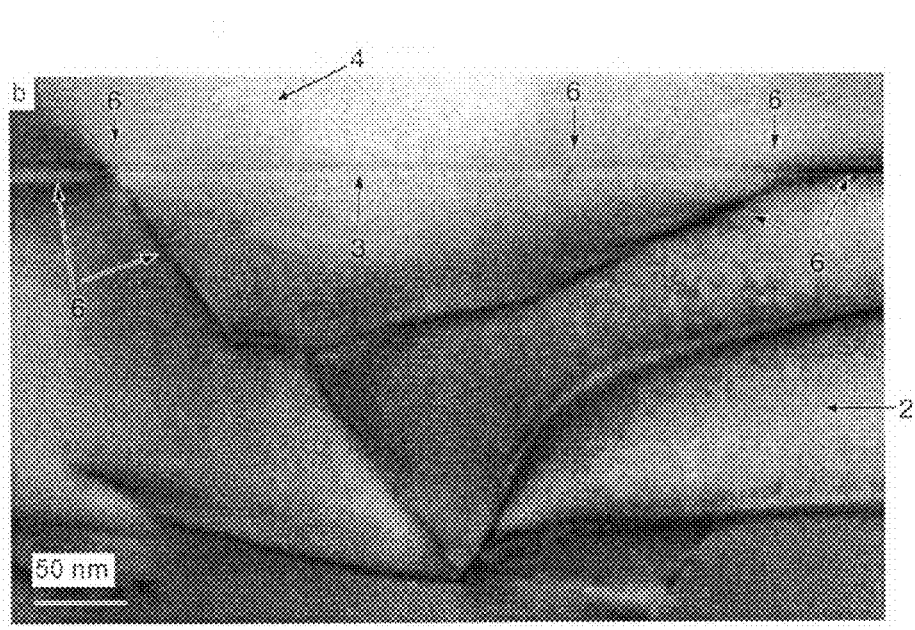
FIGS. 1 and 2 illustrate the layered structures of the present invention by cross-sectional Transmission Electron Microscopy.

The subject matter of the invention is a multilayer structure, comprising a substrate and a layer of silicon and germanium (SiGe layer) deposited heteroepitaxially thereon having the composition $Si_{1-x}Ge_x$ and having a lattice constant which differs from the lattice constant of silicon. The multilayer structure includes a thin interfacial layer deposited on the SiGe layer and having the composition $Si_{1-y}Ge_y$ and at least one further layer deposited on the interfacial layer where the thin interfacial layer binds threading dislocations.

The surface of the multilayer structure is distinguished by a particularly low density of threading dislocations and pile-ups of threading dislocations and by a low roughness. A particular feature of the multilayer structure is an interfacial layer of silicon and germanium which binds threading dislocations at the interface with the SiGe layer below. As a result, a considerably smaller number of threading dislocations reaches the surface of the interfacial layer and of the at least one further layer deposited thereon.

The subject matter of the invention is also a process for producing a multilayer structure, comprising the steps of providing a layer of silicon and germanium (SiGe layer) deposited heteroepitaxially on a substrate, having the composition $Si_{1-x}Ge_x$, and having a lattice constant which differs from the lattice constant of silicon; and depositing a thin interfacial layer having the composition $Si_{1-y}Ge_y$ ("subsequent" SiGe layer) on the previously deposited SiGe layer, which thin interfacial layer binds threading dislocations, and depositing at least one further layer on the interfacial layer.

The SiGe layer may be strained or relaxed. The SiGe layer may have a constant concentration $Si_{1-x}Ge_x$ of silicon and germanium. However, it is preferably a layer in which the concentration of germanium increases in steps or continuously over the thickness of the layer (graded layer) and only reaches the concentration $Si_{1-x}Ge_x$ at the surface of the layer. The index x preferably has a value of from 0.2 to 0.5.

The SiGe layer is preferably present on a surface of silicon as substrate, most preferably on a semiconductor wafer of silicon or an SOI layer structure (silicon on insulator) with a silicon layer and an oxide layer beneath it.

According to the invention, a thin interfacial layer is deposited on the SiGe layer; this interfacial layer binds threading dislocations at the interface with the SiGe layer, so that the density of these threading dislocations at the surface of the multilayer structure is reduced considerably compared to the density of the threading dislocations on the surface of the SiGe layer. The threading dislocation density (TDD) on the surface of the multilayer structure is at most 1.5 E+4 threading dislocations/cm$^2$, preferably less than 5 E+3 threading dislocations/cm$^2$. The density of pile-ups of threading dislocations (PuD) is preferably at most 1 cm/cm$^2$. The roughness of the surface of the multilayer structure is preferably at most 2 Å rms (1 μm×1 μm measurement window). The thickness of the interfacial layer is preferably from 2 to 30 nm. If the thickness of the interfacial layer is below the lower limit of the preferred thickness range or above the upper limit, this has an adverse effect on the roughness of the surface of the interfacial layer and therefore also on the surface of the multilayer structure. The interfacial layer has a substantially constant composition $Si_{1-y}Ge_y$, where the index y may preferably assume the same values as the index x.

Figure 3:
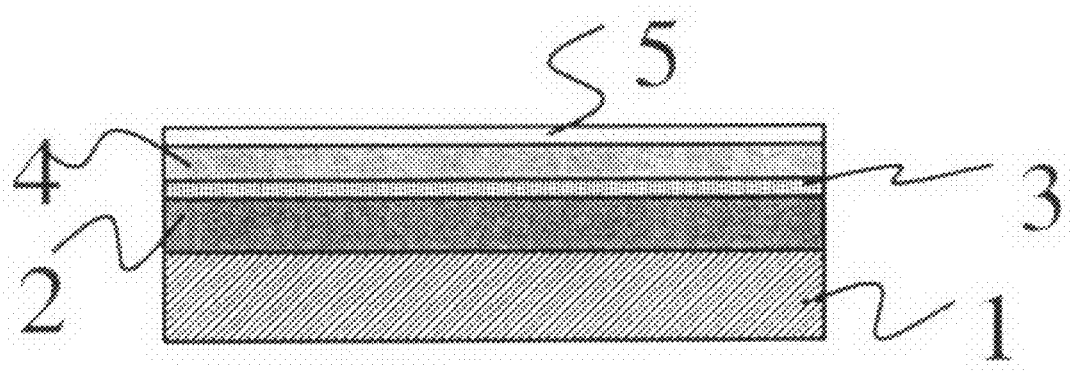
FIG. 3 illustrates one embodiment of a multilayer structure of the present invention.

FIG. 3 illustrates one embodiment of a multilayer structure according to the invention, for example as prepared in Example 2. Onto the substrate 1 is deposited an $Si_{1-x}Ge_x$ layer 2, $Si_{1-y}Ge_y$ interfacial layer 3, $Si_{1-z}Ge_z$ buffer layer 4 and strained silicon layer 5.

To deposit the interfacial layer, the SiGe layer is exposed to a gaseous mixture which contains hydrogen, a hydrogen halide compound, a silicon compound and a germanium compound. This is preferably done in an epitaxy reactor. The concentrations of the gaseous compounds are set in such a way that net deposition of material of the composition $Si_{1-y}Ge_y$ takes place under the selected temperature and pressure conditions. The deposition is preferably carried out at a temperature of between 900 and 1100° C. and at atmospheric pressure or a lower pressure. The deposition rate is greater than 0 nm/min and is preferably at most 50 nm/min.

Suitable silicon compounds include $SiH_4$ and chlorosilanes, among which dichlorosilane is preferred. Suitable germanium compounds are chlorogermanes and alkyl derivatives thereof, as well as $GeH_4$. $GeH_4$, $GeCl_4$ and $CH_3GeCl_3$ are particularly preferred. The ratio of silicon compound to germanium compound in the gas atmosphere used for deposition of the interfacial layer is set in such a way that the growing interfacial layer has the desired composition $Si_{1-y}Ge_y$. The preferred hydrogen halide compound in the gas atmosphere is HCl. The ratio of hydrogen halide compound, on the one hand, and silicon compound and germanium compound, on the other hand is preferably in the range from 100:1 to 1:1. On account of the low density of threading dislocations on the surface and the low roughness of the surface of the interfacial layer, it is particularly preferable for a layer of strained silicon to be deposited as a further layer directly on the surface of the interfacial layer. Nevertheless, it is also possible for one or more further layers to be deposited in advance. By way of example, a relaxed heteroepitaxial layer with a constant composition $Si_{1-z}Ge_z$ can be deposited on the interfacial layer as buffer layer before the layer of strained silicon; the index z may in this case preferably assume the same values as the index y. The degree of relaxation of the buffer layer is preferably greater than 90%. The buffer layer has a thickness of preferably 0.5 to 2 μm.

COMPARATIVE EXAMPLE

Silicon substrate wafers were treated at a reduced pressure in a single-wafer epitaxy reactor. The following process steps were carried out:
Step 1. Loading of the reactor.
Step 2. Heat treatment of the substrate wafer under hydrogen ($H_2$ bake) at a temperature of 1120° C.
Step 3. Deposition of an SiGe layer with an increasing germanium content (graded layer) (0-20%) at a temperature of 800-900° C.
Step 4. Deposition of a buffer layer of silicon and germanium with a constant germanium content of 20% (constant composition layer) and a thickness of 1 μm.
Step 5. Deposition of an 18 nm thick layer of strained silicon at a temperature of 700° C.
Step 6. Unloading of the multilayer structure from the reactor.

EXAMPLE

Figure 2:
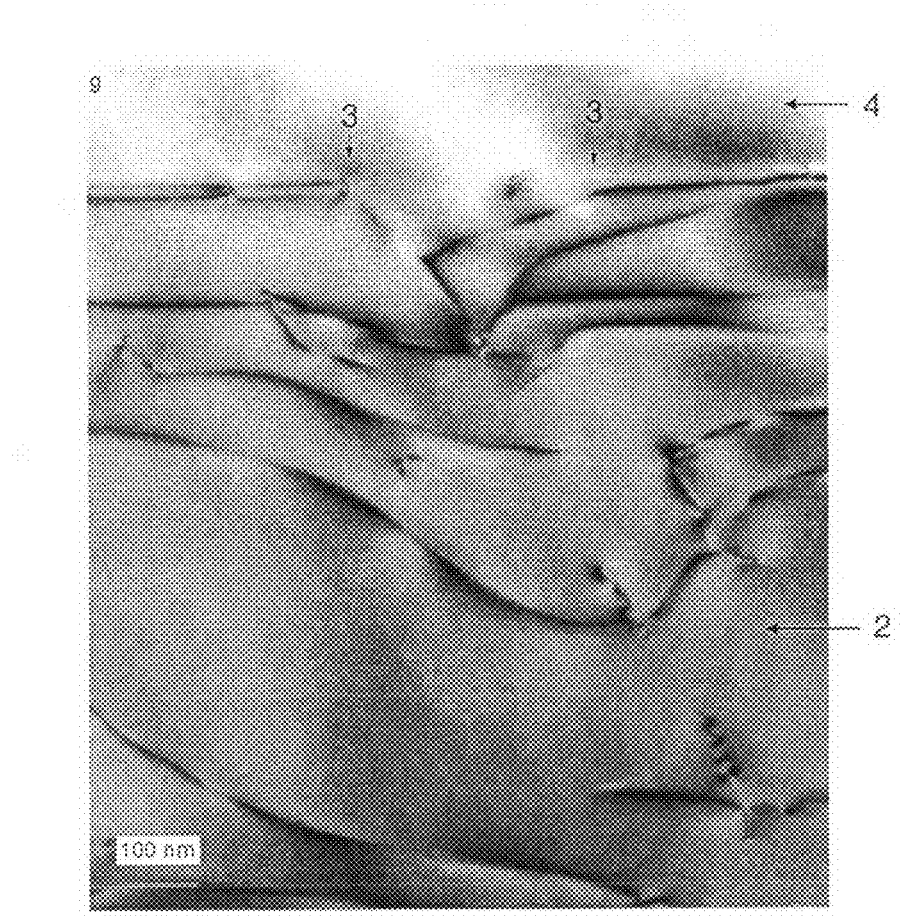

Further substrate wafers of the same type as that of the Comparative Example were treated in the same reactor as in the Comparative Example, with one difference:
Steps 1 to 3: as in the Comparative Example
Step 4: Deposition of an interfacial layer of silicon and germanium with a constant germanium content of 20% by introducing a mixture of hydrogen chloride, dichlorosilane and germane at a temperature of 1050° C.
Steps 5 to 7: same as steps 4 to 6 in the Comparative Example
Examination of the multilayer structures formed: the interfacial layer examination was carried out by cross-sectional TEM (Transmission Electron Microscopy, X-TEM). FIG. 1 clearly shows the interfacial layer between graded layer (with dislocation network) and constant composition layer. The thickness of the interfacial layer is approx. 2 to 3 nm. FIG. 2 shows how dislocations from the lower-lying SiGe layer are absorbed in the interfacial layer. The dislocations then run within the plane of the boundary between the SiGe layer and the interfacial layer and do not grow further into the buffer layer. Further with regard to FIGS. 1 and 2, reference numerals 1-5 correspond to those of FIG. 3, while reference numerals 6 pinpoint threading dislocations.

The deposition of the interfacial layer leads to a reduction in the threading dislocation density (TDD), in particular the pile-up density (PuD) of such dislocations, and to a reduction in the RMS roughness as a result of elimination of the cross-hatch structure. The morphology of the surface can be influenced by changing the process conditions within wide ranges during the deposition of the interfacial layer.

|  | Comparative Example | Example |
|---|---|---|
| TDD/cm-2 | 4E+5 | 1.3E+4 |
| PuD/cm-1 | 18 | 1.0 |
| RMS 40 μm × 40 μm | 6.5 nm | 1.6 nm |
| RMS 1 μm × 1 μm | 0.42 nm | 0.14 nm |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing a multilayer structure, comprising:
    depositing a first SiGe layer directly onto a silicon surface of a substrate, the first SiGe layer having a composition of $Si_{1-x}Ge_x$ and having a lattice constant which differs from the lattice constant of the silicon of the silicon surface;
    depositing a second SiGe interfacial layer having a thickness of from 2 to 30 nm directly onto the first SiGe layer, the SiGe interfacial layer having a composition of $Si_{1-y}Ge_y$, the SiGe interfacial layer deposited at a rate of at most 50 nm/min from a gaseous mixture comprising hydrogen, hydrogen halide, silicon compound, and germanium compound, and
    depositing at least one further layer onto the interfacial layer;
    wherein the SiGe interfacial layer reduces surface density of threading dislocations originating in the first SiGe layer by termination of threading dislocations at the boundary where the SiGe interfacial layer abuts the first SiGe layer.

2. The process of claim 1, wherein the SiGe interfacial layer is deposited at a temperature of from 900 to 1150° C.

3. The process of claim 1, wherein the SiGe interfacial layer is deposited at atmospheric pressure or a lower pressure.

4. The process of claim 1, wherein the hydrogen halide used during the deposition of the SiGe interfacial layer is HCl.

5. The process of claim 1, wherein the silicon compound used during the deposition of the SiGe interfacial layer is dichlorosilane.

6. The process of claim 1, wherein the germanium compound used during the deposition of the SiGe interfacial layer is $GeH_4$.

7. The process of claim 1, wherein the gaseous mixture contains hydrogen halide, on the one hand; and the silicon compound and germanium compound, on the other hand, in a volumetric ratio of from 100:1 to 1:1.

8. The process of claim 1, wherein the first SiGe layer is provided as a layer in which the germanium concentration increases over the thickness of the SiGe layer.

9. The process of claim 1, wherein a relaxed heteroepitaxial layer having the composition $Si_{1-z}Ge_z$ is deposited on the SiGe interfacial layer, and a layer of strained silicon is deposited on the relaxed heteroepitaxial layer having the composition $Si_{1-z}Ge_z$.

10. The process of claim 1, wherein a layer of strained silicon is deposited on the SiGe interfacial layer.

11. The process of claim 1, wherein the silicon surface is a surface of a silicon wafer.

12. The process of claim 1, wherein the silicon surface is a surface of a silicon layer lying on top of an insulating layer in an SOI wafer.

13. A process for producing a multilayer wafer, comprising:
    depositing a first SiGe layer directly onto a silicon surface of a wafer, the first SiGe layer having a composition of $Si_{1-x}Ge_x$ and having a lattice constant which differs from the lattice constant of the silicon of the silicon surface, and being deposited on the entire silicon surface of the wafer;
    depositing a second SiGe interfacial layer having a thickness of from 2 to 30 nm directly onto the first SiGe layer, the SiGe interfacial layer having a composition of $Si_{1-y}Ge_y$, the SiGe interfacial layer deposited at a rate of at most 50 nm/mm from a gaseous mixture comprising hydrogen, hydrogen halide, silicon compound, and germanium compound, and being deposited on the entire first SiGe layer, and
    depositing at least one further layer onto the interfacial layer;
    wherein the SiGe interfacial layer reduces surface density of threading dislocations originating in the first SiGe layer by termination of threading dislocations at the boundary where the SiGe interfacial layer abuts the first SiGe layer.

14. The process of claim 13, wherein the wafer is a silicon wafer.

15. The process of claim 14, wherein the silicon surface is a silicon surface of a silicon layer separated from the silicon wafer by an insulating layer.

* * * * *